(12) United States Patent
Zhou et al.

(10) Patent No.: US 11,322,527 B2
(45) Date of Patent: May 3, 2022

(54) PIXEL UNIT, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Zhichao Zhou, Guangdong (CN); Hui Xia, Guangdong (CN); Meng Chen, Guangdong (CN)

(73) Assignee: SHENZHEN CHINA STAR OPTOELECTRONICS SEMICONDUCTOR DISPLAY TECHNOLOGY CO., LTD., Guandong (CN)

( * ) Notice: Subject to any disclaimer, the term of this patent is extended or adjusted under 35 U.S.C. 154(b) by 599 days.

(21) Appl. No.: 16/096,946

(22) PCT Filed: Jun. 5, 2018

(86) PCT No.: PCT/CN2018/089933
§ 371 (c)(1),
(2) Date: Oct. 26, 2018

(87) PCT Pub. No.: WO2019/174136
PCT Pub. Date: Sep. 19, 2019

(65) Prior Publication Data
US 2021/0104559 A1    Apr. 8, 2021

(30) Foreign Application Priority Data
Mar. 13, 2018 (CN) .......................... 201810204696.8

(51) Int. Cl.
*H01L 27/12* (2006.01)
*G02F 1/1362* (2006.01)
*G02F 1/1368* (2006.01)

(52) U.S. Cl.
CPC ........ *H01L 27/1251* (2013.01); *G02F 1/1368* (2013.01); *G02F 1/136227* (2013.01);
(Continued)

(58) Field of Classification Search
CPC ............. H01L 27/1288; H01L 27/1251; H01L 27/124; G02F 1/136227; G02F 1/134309
See application file for complete search history.

(56) References Cited

U.S. PATENT DOCUMENTS 5,977,562 A * 11/1999 Hirakata ........... G02F 1/134363
257/72
9,806,202 B2 10/2017 Yamazaki et al.
(Continued)

FOREIGN PATENT DOCUMENTS

CN         1866481        11/2006
CN       101939696 A       1/2011
(Continued)

*Primary Examiner* — Stephen M Bradley
(74) *Attorney, Agent, or Firm* — PV IP PC; Wei Te Chung; Ude Lu

(57) ABSTRACT

The present invention teaches a pixel unit including thin film transistors (TFTs) and pixel electrodes corresponding to the TFTs. The pixel electrodes are connected to the source electrodes of the TFTs. Each pixel electrode includes multiple arc-shaped electrode units arranged at intervals along an axial direction around a periphery of a corresponding TFT. The electrode units are electrically connected together. The present invention adopts arc-shaped pixels (similar to concentric circles) so that liquid crystal molecules are closer to being isotropic. Then, by having different vertical alignment (VA) TFT designs in the primary pixel region and secondary pixel region and utilizing the differences in W/L (Continued)

and capacitance, different voltage levels for primary pixel electrode and secondary pixel electrode are achieved. The color shift problem is improved and the viewing angle is enhanced.

11 Claims, 5 Drawing Sheets

(52) U.S. Cl.
CPC ...... *G02F 1/136286* (2013.01); *H01L 27/124* (2013.01); *H01L 27/1288* (2013.01)

(56) References Cited

U.S. PATENT DOCUMENTS

| | | | |
|---|---|---|---|
| 2005/0083466 A1* | 4/2005 | Lee | G02F 1/134363 349/141 |
| 2014/0054630 A1* | 2/2014 | Li | G02F 1/134363 257/91 |

FOREIGN PATENT DOCUMENTS

| | | |
|---|---|---|
| CN | 102135690 | 7/2011 |
| CN | 104269410 | 1/2015 |
| CN | 104779272 A | 7/2015 |
| CN | 106154669 | 11/2016 |
| JP | 2006222462 | 8/2006 |
| JP | 2007173307 | 7/2007 |

* cited by examiner

PIXEL UNIT, MANUFACTURING METHOD THEREOF, AND DISPLAY DEVICE

RELATED APPLICATIONS

The present application is a National Phase of International Application Number PCT/CN2018/089933, filed Jun. 5, 2018, and claims the priority of China Application No. 201810204696.8 filed Mar. 13, 2018.

FIELD OF THE INVENTION

The present invention is generally related to the field of display technology, and more particularly to a pixel unit, its manufacturing method, and a related display device.

BACKGROUND OF THE INVENTION

As a popular display device, liquid crystal display (LCD) display device includes two separated substrates and a liquid crystal layer sandwiched in between. LCD produces electrical field by applying voltages to pixel electrodes and common electrodes on the substrates. The electrical field controls the deflection of liquid crystal molecules in the liquid crystal layer. LCD thereby displays pictures, together with the polarization of incident light.

Currently, LCDs using vertical alignment (VA), due to their high contrast and wide viewing angle, emerge as a promising product. To achieve a uniform viewing quality regardless it is viewed at an angle or in the front, pixels of the VA panel are often divided into two sub-pixels. The sub-pixels usually have different grayscale voltages, leading to different transmittance. As such, there would be color shift when the panel is viewed from a large angle, compromising the display quality.

SUMMARY OF THE INVENTION

An objective of the present invention is to provide a pixel unit, its manufacturing method, and a related display device, so as to obviate the shortcomings of the prior art.

To achieve the objective, the present invention provides the following technical solutions.

The present invention teaches a pixel unit, including thin film transistors (TFTs) and pixel electrodes corresponding to the TFTs. The pixel electrodes are connected to the source electrodes of the TFTs.

Each pixel electrode comprises multiple arc-shaped electrode units arranged at intervals along an axial direction around a periphery of a corresponding TFT; and the electrode units are electrically connected together.

Preferably, the TFTs of the pixel unit are TFTs using vertical alignment (VA), and each includes a gate electrode, a source electrode, an active layer, and a drain electrode. The source electrode and the gate electrode have non-overlapping projections along the vertical direction. The drain electrode and the gate electrode have non-overlapping projections along the vertical direction.

Preferably, the source electrode, the active layer, and the drain electrode of a TFT are arranged around the periphery of the gate electrode. The source electrode, the active layer, and the drain electrode are stacked. The electrode units are arranged at intervals along an axial direction in a concentric manner with the gate electrode as center.

Preferably, the pixel unit includes scan lines, data line, a primary pixel region and a secondary pixel region jointly defined by the scan lines and the data line.

Preferably, within the pixel unit, the arc-shaped electrode units have their mouths facing a center of a corresponding TFT. Each electrode unit has a second end electrically connected to a first end of an axially neighboring electrode unit.

Preferably, within the pixel unit, the arc-shaped electrode units have their mouths facing outward away from a center of a corresponding TFT.

Preferably, within the pixel unit, the drain electrode of a TFT includes an arc-shaped first drain electrode and an arc-shaped second drain electrode. The first and second drain electrodes have their mouths facing each other, and are electrically connected to the data line respectively through a branch line. The gate electrode is a part of a scan line, and is located in an area circled by the first and second drain electrode.

Preferably, within the pixel unit, the drain electrode of a TFT includes four arc-shaped drain electrode units with their mouths facing outward away from the gate electrode. The drain electrode units are a part of the data line, and are end-to-end connected to enclose an area. The gate electrode is configured inside the enclosed area, and is part of a scan line.

The present invention also teaches a display device, including the above pixel units arranged in an array.

The present invention also teaches a manufacturing method of pixel unit, including the following steps:

(1) in a single process, depositing a metallic layer using physical vapor deposition (PVD) on a substrate, forming a data line, and forming drain electrodes in a primary pixel region and a secondary pixel region through exposure and development using a photoresist pattern as mask, where, within the primary pixel region, the drain electrode comprises an arc-shaped first drain electrode and an arc-shaped second drain electrode, the first and second drain electrodes have their mouths facing each other, and are electrically connected to the data line respectively through a branch line, within the secondary pixel region, the drain electrode includes four arc-shaped drain electrode units with their mouths facing outward. The drain electrode units are a part of the data line, and are end-to-end connected to enclose an area.

(2) lifting the photoresist, depositing active layer material using sol-gel, chemical vapor deposition (CVD), or PVD, and forming active layers on the drain electrodes by lithography, where within the primary pixel region, the active layer comprises two arc-shaped elements, disposed respectively on top of the first and second drain electrodes, the active layer has a compatible shape with that formed by the first and second drain electrodes, within the secondary pixel region, the active layer comprises two U-shaped elements, disposed oppositely at where the drain electrode units are connected to the data line with their mouths facing each other;

(3) in a single process, forming source electrodes on the active layers, and forming scan lines and gate electrodes between the drain electrodes and source electrodes, where, specifically, a metallic layer is first formed using PVD, electron beam evaporation, or evaporation, surplus metal is removed with lithography, and a gate line region is formed using a half tone mask or a gray tone mask capable of producing photoresist of different thicknesses, within the primary pixel region, a scan line runs through a gap between the first and second drain electrodes, the gate electrode is at the center of the area circled by the first and second drain electrodes, the gate electrode is a part of the scan line, within the secondary pixel region, the scan line runs through a gap between the elements of the active layer, the gate electrode a part of the scan line, and is at the center of the area surrounded by the drain electrode units, within the primary and secondary pixel regions, the source electrode, the active layer, and the drain electrode are arranged around the periphery of the gate electrode, the source electrode, the active layer, and the drain electrode are stacked, the source and gate electrodes have non-overlapping projections along the vertical direction, the drain and the gate electrodes have non-overlapping projections along the vertical direction and;

(4) depositing a passivation layer, and forming multiple-arc pixel electrodes on top of and around source electrodes by first forming pixel electrode pattern on the passivation layer, depositing a metallic layer using PVD, and forming the pixel electrodes using lithography.

Within the primary and secondary pixel regions, each pixel electrode includes multiple arc-shaped electrode units arranged at intervals along an axial direction around a periphery of a corresponding TFT. The electrode units are electrically connected together.

Compared to prior art, the advantages of the present invention are as follows. The present invention adopts arc-shaped pixels (similar to concentric circles) so that liquid crystal molecules are closer to being isotropic. Then, by having different VA TFT designs in the primary pixel region and secondary pixel region and utilizing the differences in W/L and capacitance, different voltage levels for primary pixel electrode and secondary pixel electrode are achieved and. The color shift problem is improved and the viewing angle is enhanced.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

FIG. 1b is a sectional diagram showing the sections A-A and B-B of FIG. 1a.

FIG. 2b is a sectional diagram showing the sections A-A and B-B of FIG. 2a.

FIG. 3b is a sectional diagram showing the sections A-A and B-B of FIG. 3a.

FIG. 4b is a sectional diagram showing the sections A-A and B-B of FIG. 4a.

DETAILED DESCRIPTION OF PREFERRED EMBODIMENTS

Figure 1A:
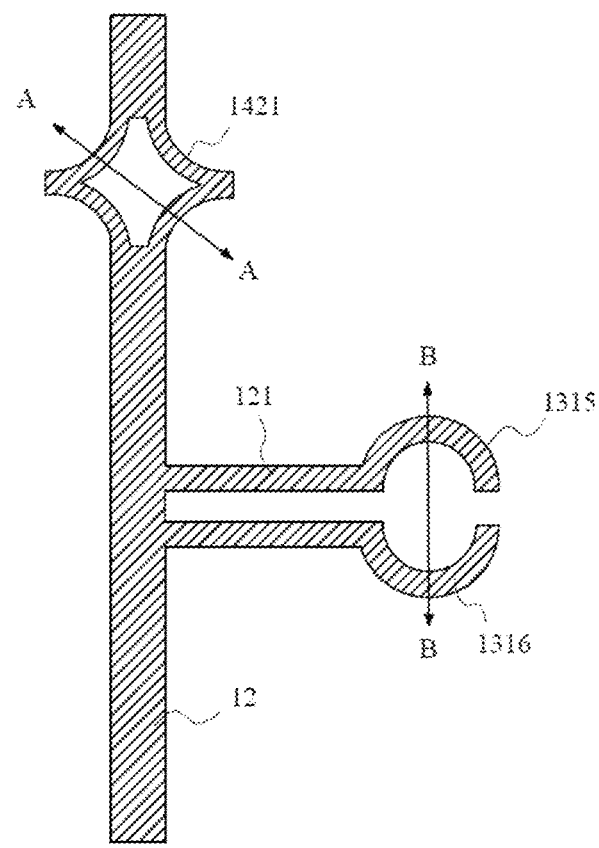
FIG. 1a is a top-view diagram showing drain electrode and data line of a pixel unit according to an embodiment of the present invention.

The following descriptions for the respective embodiments are specific embodiments capable of being implemented for illustrations of the present invention with referring to appended figures.

It should be noted that direction or location terms such as "center," "top," "bottom," "left," "right," "vertical," "lateral," "inside," "outside," etc. are based on the directional and locational relationship shown in the drawings. They are used to facilitate the description of the present invention, not to indicate or imply the referred element has a specific direction, should be structured or operated along a specific direction. They therefore do not constitute limitations to the present invention. In addition, the elements designated as "first," "second," "third," etc. and these terms are for reference only. They do not indicate or imply the elements' relative importance.

It should be noted that, unless explicitly specified otherwise, terms like "dispose," "join," "connect," etc. should be interpreted broadly. For example, "connect" could mean a fixed connection, a detachable connection, or an integral connection. It may also mean a mechanical connection or an electrical connection. It may be a direct connection, a connection through an intermediate medium, or an internal connection between two elements. For persons skilled in the related art, they should be able to understand the specific meanings of these terms within the context of the present invention.

As shown in FIGS. 1a, 3a, 4a, 4b, and 5, a pixel unit 10 according to an embodiment of the present invention includes a scan line 11 and a data line 12. The scan line 11 and the data line 12 jointly define a primary pixel region 13 and a secondary pixel region 14.

The scan line 11 and the data line 12 are perpendicular and insulated from each other.

Each primary pixel region 13 includes a primary thin film transistor (TFT) 131 and a first pixel electrode 132 connected to the primary TFT 131.

The primary TFT 131 is a TFT using vertical alignment (VA), and includes a gate electrode 1311, a source electrode 1312, an active layer 1313, and a drain electrode 1314. The source electrode 1312 and the gate electrode 1311 have non-overlapping projections along the vertical direction. The drain electrode 1314 and the gate electrode 1311 have non-overlapping projections along the vertical direction.

As the TFT adopts the VA structure, the gate and source electrodes have non-overlapping vertical projections, and the gate and drain electrodes have non-overlapping vertical projections, the parasitic capacitance and dimension of the TFT is reduced.

In one embodiment, the source electrode 1312, the active layer 1313, and the drain electrode 1314 are arranged around the periphery of the gate electrode 1311. The source electrode 1312, the active layer 1313, and the drain electrode 1314 are stacked.

Furthermore, each drain electrode 1314 includes an arc-shaped first drain electrode 1315 and an arc-shaped second drain electrode 1316. The first and second drain electrodes 1315 and 1316 have their mouths facing each other, and are spaced by a gap.

The first and second drain electrodes 1315 and 1316 are electrically connected to the data line 12 respectively through a branch line 121.

In one embodiment, the two branch lines 121 are parallel.

The gate electrode 1311 is a part of the scan line 11, and is located in an area circled by the first and second drain electrodes 1315 and 1316. The scan line 11 runs through the gap between first and second drain electrodes 1315 and 1316.

In an embodiment, the scan line 11, the gate electrode 1311, and the drain electrode 1314 are formed on a same plane.

The active layer 1313 includes two arc-shaped (semi-circular) elements, disposed respectively on top of the first and second drain electrodes 1315 and 1316. The active layer has a compatible shape with that formed by the first and second drain electrodes 1315 and 1316.

The source electrode 1312 includes two arc-shaped (semi-circular) elements, disposed respectively on top of the elements of the active layer 1313. The source electrode 1312 have a compatible shape with that formed by the first and second drain electrodes 1315 and 1316.

The scan line 11 runs through the gap between the first and second drain electrodes 1315 and 1316. The gate electrode 1311 is at the center of the area circled by the first and second drain electrodes 1315 and 1316. The gate electrode 1311 is a part of the scan line 11. The gate electrode 1311 preferably has a circular shape.

The first pixel electrode 132 includes multiple arc-shaped electrode units 1321. Two of the electrode units 1321 are formed directly on top of and electrically connected to two arc-shaped source electrodes 1312.

The electrode units 1321 are arranged at intervals along an axial direction in a concentric manner with the gate electrode 1311 as the center. The electrode units 1321 surround the gate electrode 1311 and have their mouths facing the gate electrode 1311.

The electrode units 1321 of the first pixel electrode 132 are partitioned into two groups corresponding to two drain electrodes 1315 and 1316, respectively. The two groups of electrode units 1321 are disposed symmetrically across the scan line 11. The electrode units 1321 of each group is electrically connected together.

Preferably, each electrode unit 1321 within a group has a second end electrically connected to a first end of an axially neighboring electrode unit 1321 of the same group. The electrode units 1321 of each group are therefore end-to-end electrically connected into a planar curve that winds back and forth around the gate electrode 1311 at a continuously increasing distance from the gate electrode 1311.

Each secondary pixel region 14 includes a secondary TFT 141 and a second pixel electrode 142 connected to the secondary TFT 141.

The secondary TFT 141 is a TFT using vertical alignment (VA), and includes a gate electrode 1411, a source electrode 1412, an active layer 1413, and a drain electrode 1414. The source electrode 1412 and the gate electrode 1411 have non-overlapping projections along the vertical direction. The drain electrode 1414 and the gate electrode 1411 have non-overlapping projections along the vertical direction.

As the TFT adopts the VA structure, the gate and source electrodes have non-overlapping vertical projections, and the gate and drain electrodes have non-overlapping vertical projections, the parasitic capacitance and dimension of the TFT is reduced.

In one embodiment, the source electrode 1412, the active layer 1413, and the drain electrode 1414 are arranged around the periphery of the gate electrode 1411. The source electrode 1412, the active layer 1413, and the drain electrode 1414 are stacked.

Furthermore, each drain electrode 1414 includes four arc-shaped drain electrode units 1415 with their mouths facing outward away from the gate electrode 1411. The drain electrode units 1415 are a part of the data line 12, and are end-to-end connected to enclose an area. The gate electrode 1411 is configured inside the enclosed area, and is part of the scan line 11a.

The active layer 1413 includes two U-shaped elements, disposed oppositely with their mouths facing each other at where the drain electrode units 1415 are connected to the data line 12.

The source electrode 1412 includes two U-shaped elements, disposed oppositely with their mouth facing each other on top of the elements of the active layer 1413, respectively. The source electrode 1412 have a compatible shape with that formed by the elements of the active layer 1413.

The scan line 11a runs through a gap between the elements of the active layer 1413. The gate electrode 1411 is at the center of the area surrounded by the drain electrode units 1415. The gate electrode 1411 is a part of the scan line 11a. The gate electrode 1411 preferably has a rectangular shape and, more preferably, a square shape.

The second pixel electrode 142 includes multiple arc-shaped electrode units 1421. Four of the electrode units 1421 are connected into two U-shaped elements, each formed directly on top of and electrically connected to two U-shaped elements of the source electrode 1412.

The other electrode units 1421 are arranged at intervals along an axial direction with the gate electrode 1411 as the center. These electrode units 1421 surround the gate electrode 1411 and have their mouths facing outward away from the gate electrode 1411. All electrode units 1421 are arranged in a star-shaped pattern.

Furthermore, the electrode units 1421 of the second pixel electrode 142 are partitioned into two groups disposed symmetrically across the scan line 11a. The electrode units 1421 of each group is electrically connected together.

Preferably, each electrode unit 1421 within a group is electrically connected by a connection line that sequentially crosses each electrode unit 1421.

The present invention also teaches a display device including multiple pixel units arrange in an array.

Figure 1B:
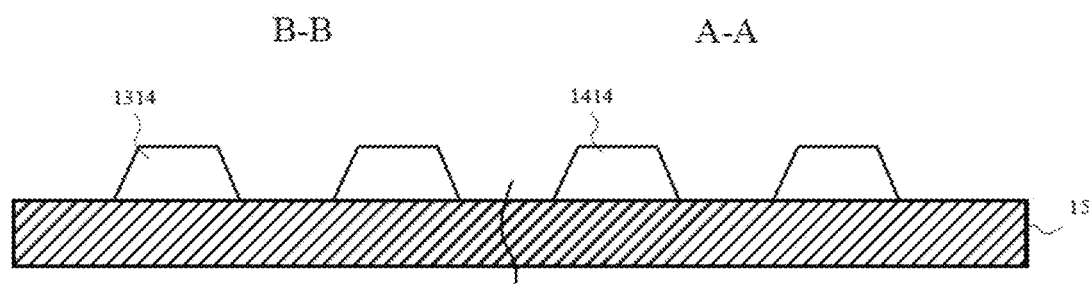

The pixel unit is manufactured as follows:

S1: as shown in FIGS. 1a and 1b, forming data line 12, drain electrodes 1314 and 1414 in a single process.

In one embodiment, physical vapor deposition (PVD) is used first to deposit a metallic layer, and drain electrode pattern is formed through exposure and development using a photoresist pattern as mask.

FIG. 1b provides sectional diagrams along the A-A section and B-B section of FIG. 1a.

Figure 2A:
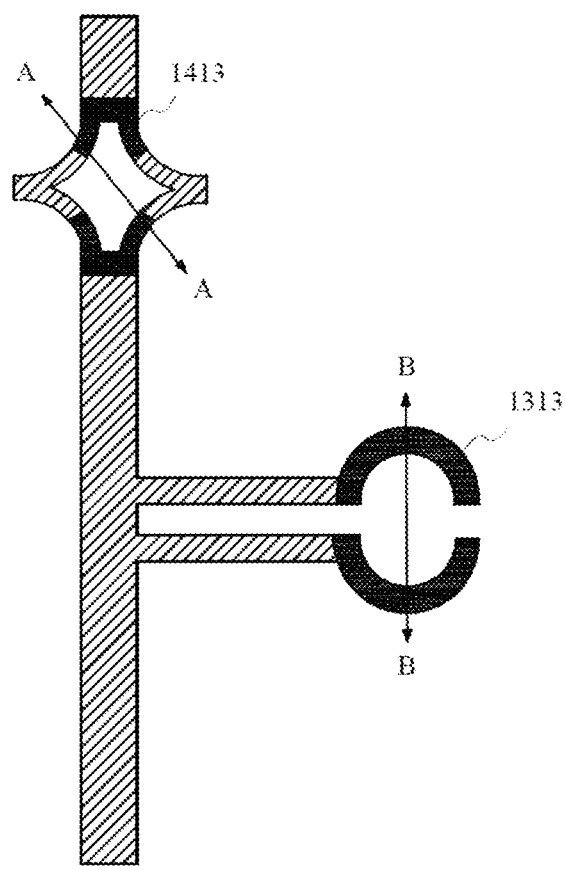
FIG. 2a is a top-view diagram showing active layer of a pixel unit according to an embodiment of the present invention.
Figure 2B:
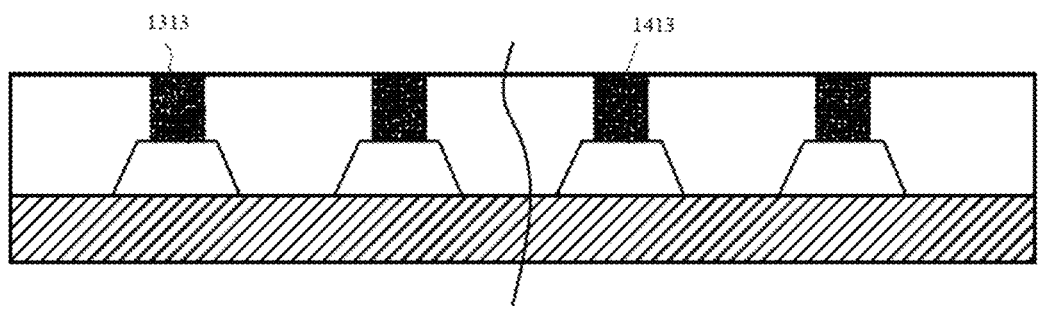

S2: as shown in FIGS. 2a and 2b, forming active layers 1313 and 1413.

In ono embodiment, the active layers are formed by lifting the photoresist, depositing the active layer material using sol-gel, chemical vapor deposition (CVD), or PVD, and then forming patterns for active layers 1313 and 1413 by lithography. The active layer material may be oxide semiconductor with indium gallium zinc oxide (IGZO) as representative, poly-silicon, amorphous silicon, or organic semiconductor.

FIG. 2b provides sectional diagrams along the A-A section and B-B section of FIG. 2a.

Figure 3A:
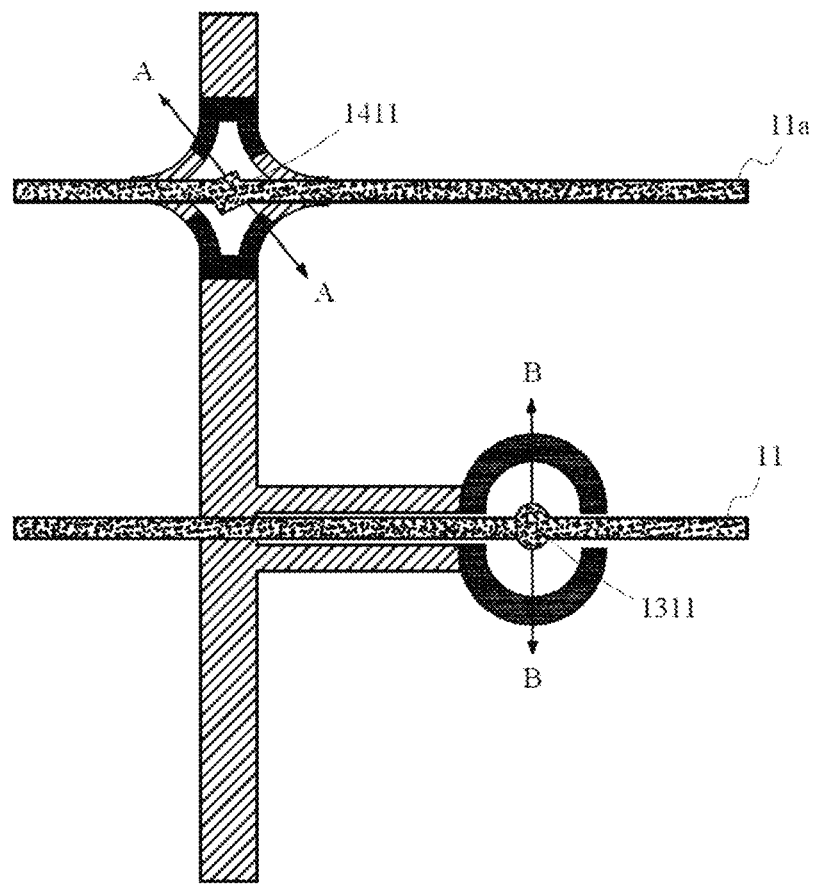
FIG. 3a is a top-view diagram showing scan line, gate electrode, and source electrode of a pixel unit according to an embodiment of the present invention.
Figure 3B:
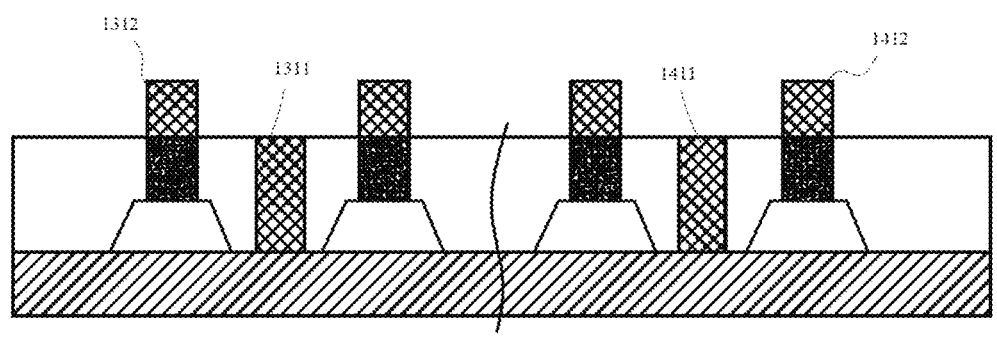

S3: as shown in FIGS. 3a and 3b, forming source electrodes 1312 and 1412 on active layers 1313 and 1413 in a single process, and simultaneously forming scan lines 11 and 11a, and gate electrodes 1311 and 1411 between source and drain electrodes.

In one embodiment, a metallic layer is first formed using PVD, electron beam evaporation, or evaporation, surplus metal is removed with lithography, and a region on the metallic lines (e.g., gate line region) is formed whose thickness is greater than other regions. The exposure may be conducted using a mask capable of producing photoresist of different thicknesses such as half tone mask or gray tone mask.

Figure 4A:
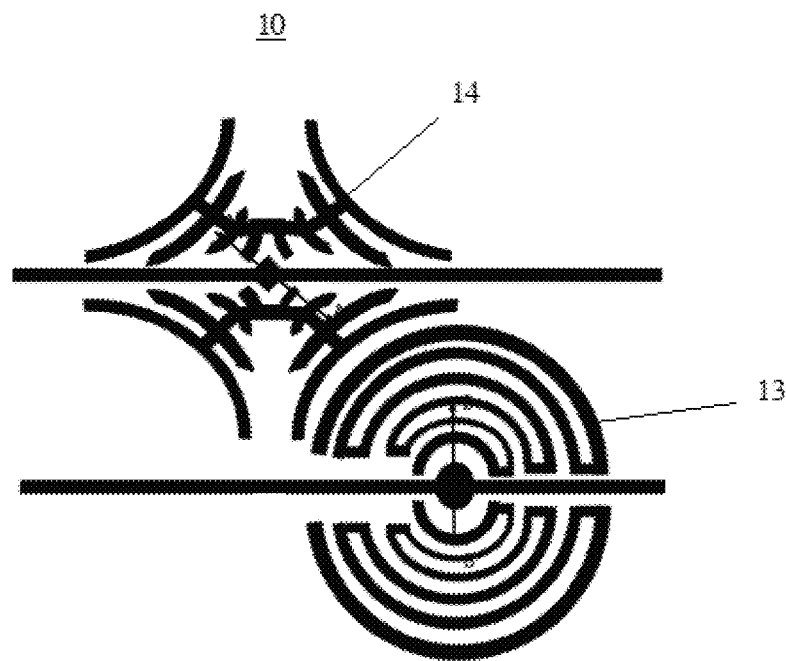
FIG. 4a is a top-view diagram showing pixel electrodes of a pixel unit according to an embodiment of the present invention.
Figure 4B:
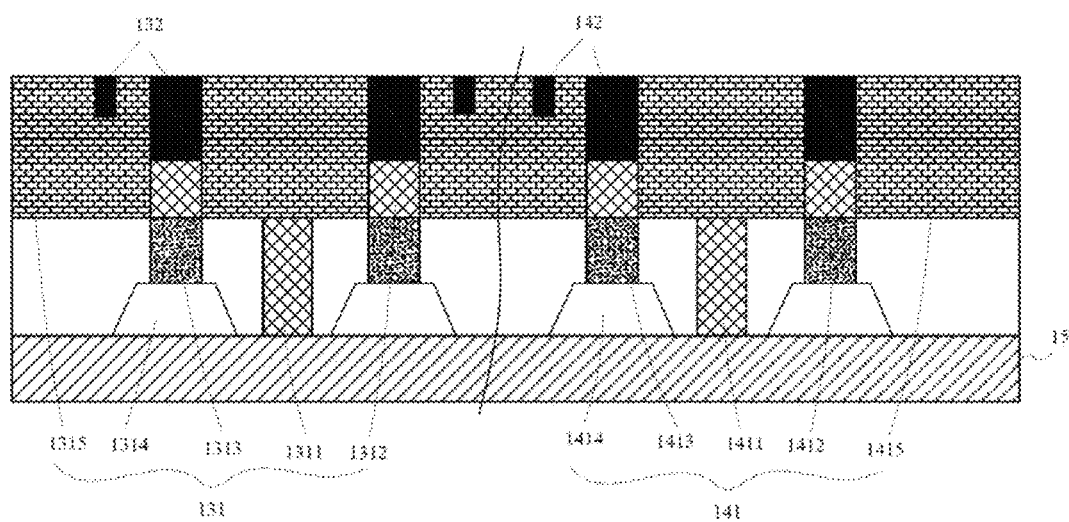
Figure 5:
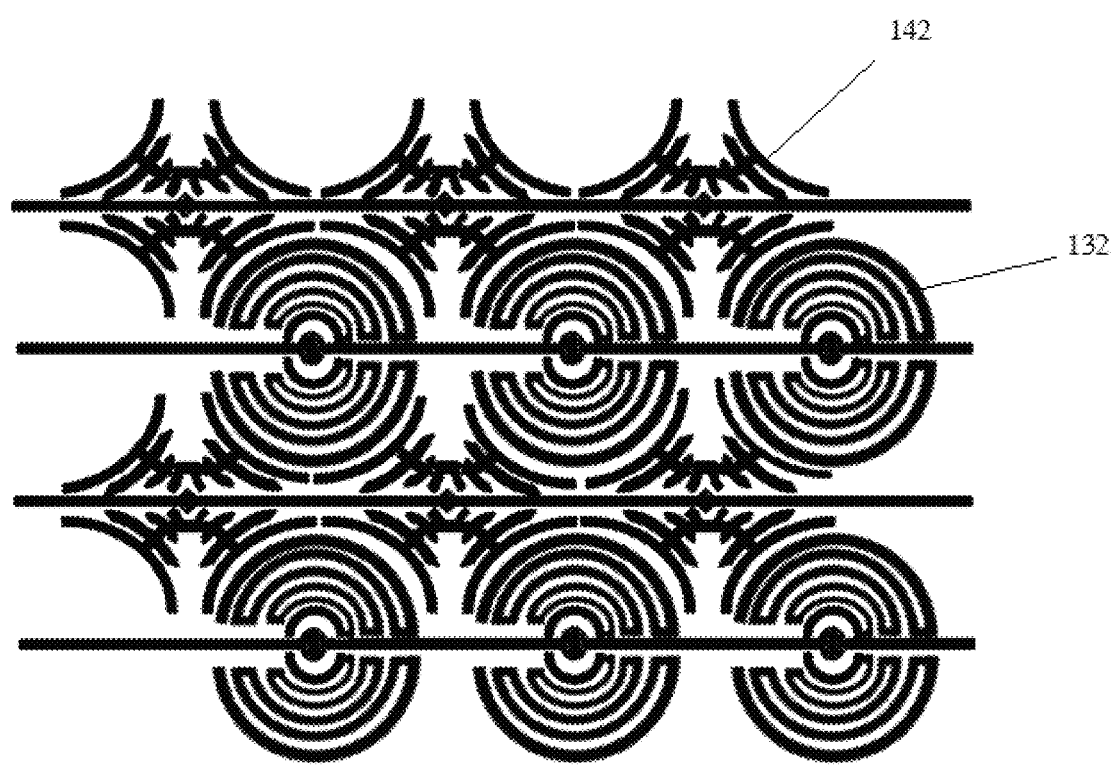
FIG. 5 is a schematic diagram showing a pixel unit of a display device according to an embodiment of the present invention.

S4: as shown in FIGS. 4a and 4b, depositing a passivation layer (PV) and forming multiple-arc pixel electrodes 132 and 142 on top of and around source electrodes.

In one embodiment, pixel electrodes 132 and 142 are formed by first forming pixel electrode pattern on the passivation layer, depositing a metallic layer using PVD, and forming the pixel electrodes using lithography.

As described above, the present invention adopts different VA TFT designs in the primary pixel region and secondary pixel region, thereby achieving different pixel voltages and arc-shaped arrangement of liquid crystal molecules. The color shift and viewing angle of VA-type liquid crystal displays is better improved.

Above are embodiments of the present invention, which does not limit the scope of the present invention. Any equivalent amendments within the spirit and principles of the embodiment described above should be covered by the protected scope of the invention.

What is claimed is:

1. A pixel unit, comprising thin film transistors (TFTs) and pixel electrodes corresponding to the TFTs, wherein the pixel electrodes are connected to the source electrodes of the TFTs;
    each pixel electrode comprises multiple arc-shaped electrode units arranged at intervals along an axial direction around a periphery of a corresponding TFT; and the electrode units are electrically connected together;
    wherein the TFTs of the pixel unit are TFTs using vertical alignment (VA); each TFT comprises a gate electrode, a source electrode, an active layer, and a drain electrode; the source electrode and the gate electrode have non-overlapping projections along a vertical direction; and the drain electrode and the gate electrode have non-overlapping projections along the vertical direction;
    wherein the source electrode, the active layer, and the drain electrode of a TFT are arranged around the periphery of the gate electrode; the source electrode, the active layer, and the drain electrode are stacked; and the electrode units are arranged at intervals along an axial direction with the gate electrode as center.

2. The pixel unit according to claim 1, further comprising scan lines, a data line, and a primary pixel region and a secondary pixel region jointly defined by the scan lines and the data line.

3. The pixel unit according to claim 2, wherein the arc-shaped electrode units have their mouths facing a center of a corresponding TFT; and each electrode unit has a second end electrically connected to a first end of an axially neighboring electrode unit.

4. The pixel unit according to claim 2, wherein the arc-shaped electrode units have their mouths facing outward away from a center of a corresponding TFT.

5. The pixel unit according to claim 2, wherein
    the drain electrode of a TFT comprises an arc-shaped first drain electrode and an arc-shaped second drain electrode; the first and second drain electrodes have their mouths facing each other, and are electrically connected to the data line respectively through a branch line; and the gate electrode is a part of a scan line, and is located in an area circled by the first and second drain electrode.

6. The pixel unit according to claim 2, wherein
    the drain electrode of a TFT comprises four arc-shaped drain electrode units with their mouths facing outward away from the gate electrode; the drain electrode units are a part of the data line, and are end-to-end connected to enclose an area; and the gate electrode is configured inside the enclosed area, and is part of a scan line.

7. The pixel unit according to claim 1, wherein the arc-shaped electrode units have their mouths facing a center of a corresponding TFT; and each electrode unit has a second end electrically connected to a first end of an axially neighboring electrode unit.

8. The pixel unit according to claim 1, wherein the arc-shaped electrode units have their mouths facing outward away from a center of a corresponding TFT.

9. The pixel unit according to claim 1, wherein
    the drain electrode of a TFT comprises an arc-shaped first drain electrode and an arc-shaped second drain electrode; the first and second drain electrodes have their mouths facing each other, and are electrically connected to the data line respectively through a branch line; and the gate electrode is a part of a scan line, and is located in an area circled by the first and second drain electrode.

10. The pixel unit according to claim 1, wherein
    the drain electrode of a TFT comprises four arc-shaped drain electrode units with their mouths facing outward away from the gate electrode; the drain electrode units are a part of the data line, and are end-to-end connected to enclose an area; and the gate electrode is configured inside the enclosed area, and is part of a scan line.

11. A display device, comprising a plurality of pixel units as claimed in claim 1 arranged in an array.

* * * * *